(12) United States Patent
Imai et al.

(10) Patent No.: US 7,067,956 B2
(45) Date of Patent: Jun. 27, 2006

(54) SURFACE ACOUSTIC WAVE DEVICE, FILTER DEVICE AND METHOD OF PRODUCING THE SURFACE ACOUSTIC WAVE DEVICE

(75) Inventors: Masahiko Imai, Kawasaki (JP); Michio Miura, Kawasaki (JP); Takashi Matsuda, Kawasaki (JP); Masanori Ueda, Kawasaki (JP); Osamu Ikata, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 226 days.

(21) Appl. No.: 10/653,213

(22) Filed: Sep. 3, 2003

(65) Prior Publication Data

US 2004/0041496 A1    Mar. 4, 2004

(30) Foreign Application Priority Data

Sep. 4, 2002    (JP)    .............................. 2002-258642

(51) Int. Cl.
    *H03H 9/25*    (2006.01)
(52) U.S. Cl. .............................. 310/313 D; 310/313 R; 310/324
(58) Field of Classification Search ............ 310/313 R, 310/313 D, 324
    See application file for complete search history.

(56) References Cited

U.S. PATENT DOCUMENTS

| | | | |
|---|---|---|---|
| 4,216,401 A * | 8/1980 | Wagner | 310/313 R |
| 4,516,095 A * | 5/1985 | Lee | 333/194 |
| 5,129,262 A * | 7/1992 | White et al. | 73/599 |
| 5,506,552 A * | 4/1996 | Seki et al. | 333/195 |
| 6,236,141 B1 * | 5/2001 | Sato et al. | 310/313 R |
| 6,445,265 B1 * | 9/2002 | Wright | 333/193 |
| 6,803,698 B1 * | 10/2004 | Tabota | 310/313 R |

FOREIGN PATENT DOCUMENTS

| | | |
|---|---|---|
| JP | 3-101280 | 4/1991 |
| JP | 2516817 | 7/1996 |
| JP | 10-84246 | 3/1998 |
| JP | 11-55070 | 2/1999 |
| JP | 11-55070 | 12/1999 |
| JP | 2000-236231 | 8/2000 |
| JP | 2001-53579 | 2/2001 |

OTHER PUBLICATIONS

"Theoretical Analysis of SAW Propagation Characteristics Under the Strained Medium and Applications for High Temperature Stable High Coupling SAW Substrates", Yamanouchi et al, *1999 IEEE Ultrasonics Symposium*, pp. 239-242.

"Temperature Stable SAW Devices Using Directly Bonded LiTaO3/Glass Substrates", Sato et al, *1998 IEEE Ultrasonics Symposium*, pp. 335-338.

"SAW Properties of SiO2/128° Y-X LiNbO3 Structure Fabricated by Magnetron Sputtering Technique", Yamanouchi et al, *IEEE Transactions on Sonics and Ultrasonics*, vol. SU-31, No. 1, Jan. 1984, pp. 51-57.

* cited by examiner

*Primary Examiner*—Thomas M. Dougherty
(74) *Attorney, Agent, or Firm*—Arent Fox PLLC

(57) ABSTRACT

A surface acoustic wave device includes a piezoelectric substrate on which resonators having comb-like electrodes are formed; and a silicon substrate that is directly bonded to the piezoelectric substrate and is less expansive than the piezoelectric substrate, a cavity being formed in the silicon substrate and being located below at least one of the resonators.

10 Claims, 7 Drawing Sheets

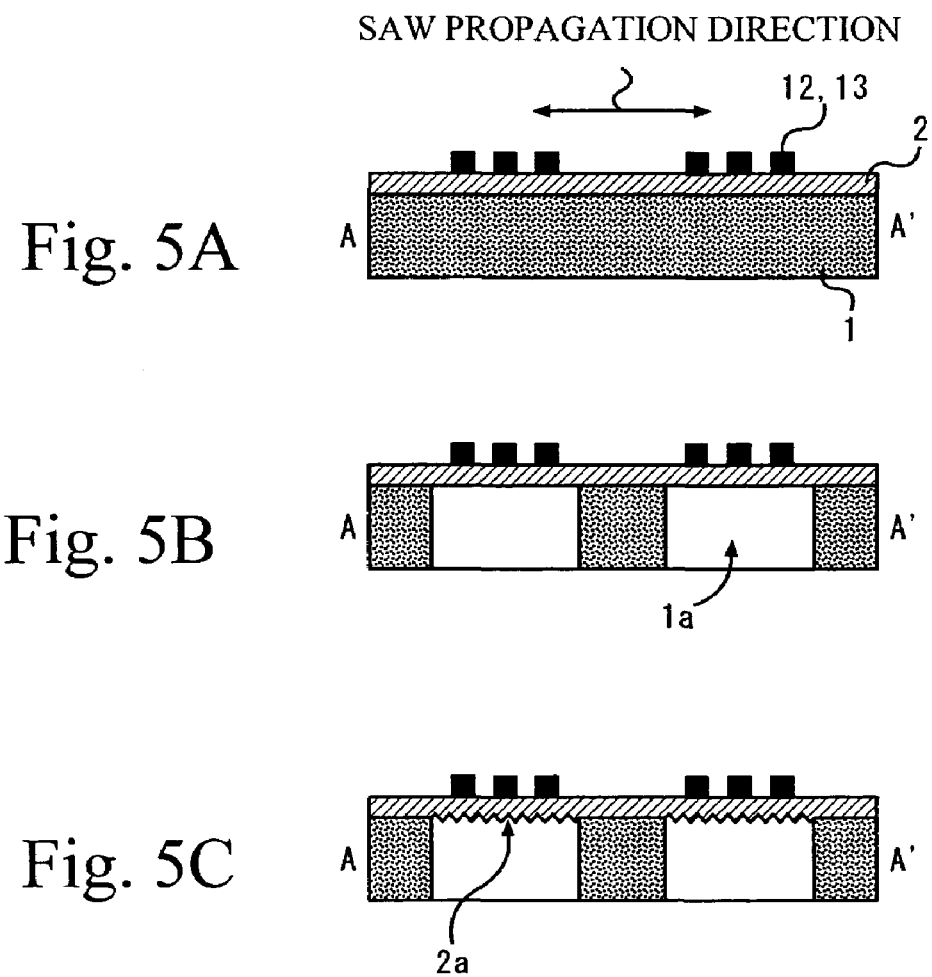
Fig. 5A
Fig. 5B
Fig. 5C
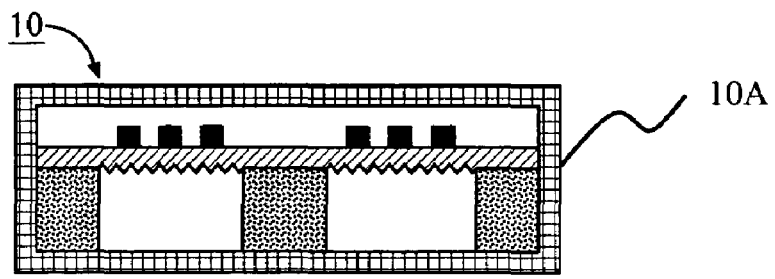
Fig. 6

SAW PROPAGATION DIRECTION

SAW PROPAGATION DIRECTION

SURFACE ACOUSTIC WAVE DEVICE, FILTER DEVICE AND METHOD OF PRODUCING THE SURFACE ACOUSTIC WAVE DEVICE

BACKGROUND OF THE INVENTION

1. Field of the Invention

The present invention generally relates to a surface acoustic wave device using a piezoelectric substrate and a low expansion material. The present invention also relates to a filter device using such a surface acoustic wave device and a method of producing the same.

2. Description of the Related Art

Nowadays, the surface acoustic wave device is widely used as a band-pass filter of a portable phone. The surface acoustic wave filter enables a compact, less-expensive filter and resonator, and is a key component for downsizing the communication devices such as portable phones.

The filter using the surface acoustic wave device is required to have higher performance as the portable phone technically and functionally advances. Generally, the surface acoustic wave filter has a frequency characteristic that depends on temperature. It is required to improve the temperature stability of the surface acoustic wave filter.

As is known lithium tantalate (LiTaO$_3$: LT), which is in heavy usage as a material for the substrate of the surface acoustic wave device, is a piezoelectric material with a large electromechanical coupling factor.

Piezoelectric material having a large electromechanical coupling factor generally exhibits poor temperature stability. In contrast, piezoelectric material having good temperature stability such as quartz has poor electromechanical coupling coefficient. Therefore, the surface acoustic wave device with the LT substrate is advantageous to realizing a broadband filter characteristic, although it does not have comparatively good temperature stability.

It is strongly desired to realize a material that has a large electromechanical coupling coefficient and good temperature stability. There are some proposals to attempt to realize such material. Some examples of such proposals are illustrated in FIGS. 1A through 1D.

FIG. 1A shows a conventional surface acoustic wave device 100. This device is described in, for example, Yamanouchi et al., IEEE Trans. On Sonics and Ultrasonics., vol. SU-31, pp. 51–57, 1984. Hereinafter, the device 100 is referred to as the first prior art. The surface acoustic wave device 100 according to the first prior art has a piezoelectric substrate 11 made of lithium niobate (LiNbO$_3$: LN) or LT on which comb-like electrodes are formed. The surface of the piezoelectric substrate 100 is coated with a quartz film 14, which as a temperature coefficient opposite to that of LT or LN. The quartz film 14 functions to cancel the temperature characteristic of the piezoelectric substrate 11, so that the temperature stability can be improved.

FIG. 1B shows another conventional surface acoustic wave device 200, which is described in Japanese Patent No. 25168171. Hereinafter, the device 200 is referred to as the second prior art. A polarization-inverted layer 15 is provided on the surface of the LT or LN substrate 11 on which the comb-like electrodes 12 are formed. The polarization-inverted layer 15 has a thickness less than the wavelength of a surface acoustic wave (SAW) that travels on the surface of the substrate 11. The electric field short-circuiting effect of the polarization-inverted layer 15 is used to improve the temperature stability.

FIG. 1C shows yet another conventional surface acoustic wave device 300 described in, for example, Japanese Laid-Open Patent Application No. 11-55070 or Ohnishi et al., Proc. Of IEEE Ultrasonics Symposium, pp. 335–338, 1998. The device 300 is referred to as the third prior art. The device 300 has a thinner piezoelectric substrate 11a than the substrate 11 shown in FIGS. 1A and 1B, and another substrate 16, which is thicker than the substrate 11a and is made of a low expansion. The substrate 16 is directly bonded to the piezoelectric substrate 11a. The low-expansion substrate 16 suppresses expansion and compression of the piezoelectric substrate 11a caused by temperature change, so that the temperature stability can be improved.

However, the surface acoustic wave device 100 according to the first prior art has a disadvantage in that there is a difficulty in forming the quartz film 14 having an even thickness. The quarts film 14 is provided on even the comb-like electrodes 12, this increasing the propagation loss of the surface acoustic wave.

The surface acoustic wave device 200 according to the second prior art has a difficulty in controlling the depth of the polarization-inverted layer. This brings about difficulty in fabrication and degrades the yield. The surface acoustic wave 300 according to the third prior art requires a mirror surface for satisfactory bonding. However, the mirror surface subject to bonding may cause reflection of a bulk wave, which may degrades the filter characteristic.

FIG. 1D shows a further conventional surface acoustic device 400 described in, for example, Japanese Laid-Open Patent Application No. 2001-53579. The device 400 is hereinafter referred to as the fourth prior art. The back surface of the piezoelectric substrate 11a opposite to the front surface thereof on which the comb-like electrodes 12 are formed is made rough. A reference numeral 18 indicates such a rough surface of the piezoelectric substrate 11a. The piezoelectric substrate 11a thus formed is bonded to the low-expansion substrate 17 b means of an adhesive layer 17.

The fourth prior art may improve the filter characteristic. However, the adhesive layer 17 interposed between the piezoelectric substrate 11a and the low-expansion substrate 16 may prevent the aforementioned improvement in the temperature characteristic. Further, the adhesive force at the interface is weakened, and the improvements in the temperature stability are degraded.

SUMMARY OF THE INVETNION

It is a general object of the present invention to provide a surface acoustic wave device in which the above disadvantages are eliminated.

A more specific object of the present invention is to provide a surface acoustic wave device that has a large electromechanical coupling factor, improved temperature stability and good productivity and to provide a filter device employing such a surface acoustic wave device.

Another object of the present invention is to provide a method of producing the surface acoustic wave device mentioned above.

According to an aspect of the present invention, there is provided a surface acoustic wave device comprising: a piezoelectric substrate on which resonators having comb-like electrodes are formed; and a silicon substrate that is directly bonded to the piezoelectric substrate and is less expansive than the piezoelectric substrate, a cavity being formed in the silicon substrate and being located below at least one of the resonators.

According to another aspect of the present invention, there is provided a surface acoustic wave device comprising: a piezoelectric substrate on which resonators having comb-like electrodes are formed; and a silicon substrate that is directly bonded to the piezoelectric substrate and is less expansive than the piezoelectric substrate, the silicon substrate having a resistivity equal to or greater than 10 Ω·cm.

According to yet another aspect of the present invention, there is provided a surface acoustic wave device comprising: a piezoelectric substrate on which resonators having comb-like electrodes are formed; and a silicon substrate that is directly bonded to the piezoelectric substrate and is less expansive than the piezoelectric substrate, the resonators being located at a distance d from ends of the device in a direction in which a surface acoustic wave propagates, the distance d satisfying d≧3 tp where tp is a thickness of the piezoelectric substrate.

According to a further object of the present invention, there is provided a method of fabricating a surface acoustic wave device comprising the steps of: directly bonding a piezoelectric substrate on which resonators having comb-like electrodes are formed, and a silicon substrate that is directly bonded to the piezoelectric substrate and is less expansive than the piezoelectric substrate; and forming a cavity in the silicon substrate so that the cavity is located below at least one of the resonators.

According to a still further object of the present invention, there is provided a method of fabricating a surface acoustic wave device comprising the steps of: directly bonding a piezoelectric substrate and a silicon substrate that is less expansive than the piezoelectric substrate; and forming resonators on the piezoelectric substrate so as to be located at a distance d from ends of the device in a direction in which a surface acoustic wave propagates, the distance d satisfying d≧3 tp where tp is a thickness of the piezoelectric substrate.

BRIEF DESCRIPTION OF THE DRAWINGS

Other objects, features and advantages of the present invention will become more apparent from the following detailed description when read in conjunction with the accompanying drawings, in which

FIGS. 5A, 5B and 5C are respectively cross-sectional views of a process of fabricating the surface acoustic wave device according to the first embodiment of the present invention;

FIG. 6 is a cross-sectional view of a device in which the surface acoustic wave device shown in FIGS. 2 and 3 is packaged;

DESCRIPTION OF THE PREFERRED EMBODIMENTS

A description will now be given of preferred embodiments of the present invention with reference to the accompanying drawings.

First Embodiment

A surface acoustic wave device according to a first embodiment has a unified substrate in which a piezoelectric substrate and another substrate made of a low expansion material having a relatively low thermal expansion coefficient such as silicon are directly bonded. A cavity is formed in the unified substrate by RIE (Reactive Ion Etching). The bottom surface of the cavity, which is a part of the unified substrate is made rough. With this structure, it becomes possible to realize a surface acoustic wave device that has a large electromagnetic coupling coefficient, good temperature stability and improved productivity without degrading filter performance.

Figure 1A:
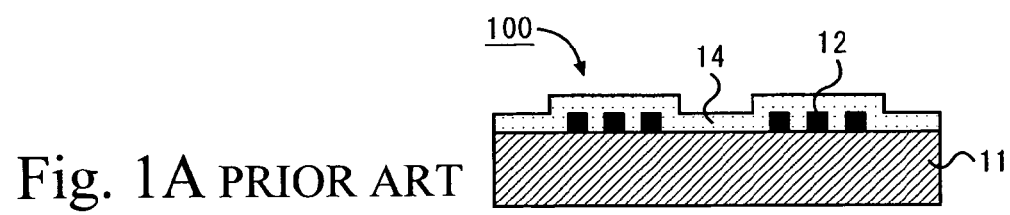
FIGS. 1A, 1B, 1C and 1D are cross-sectional views of conventional surface acoustic wave devices.
Figure 1B:
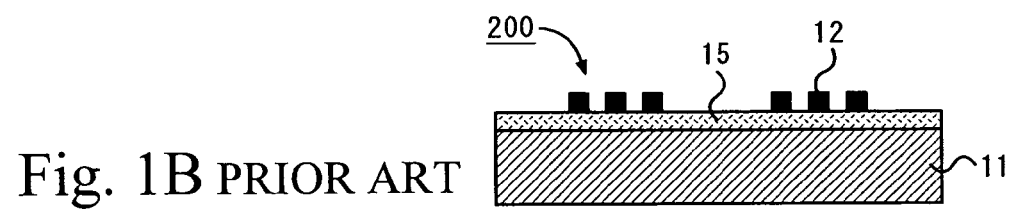
Figure 1C:
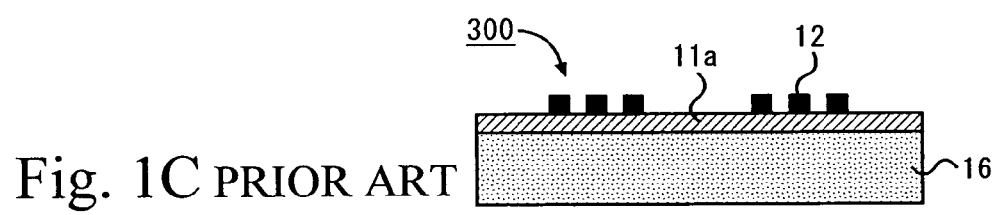
Figure 1D:
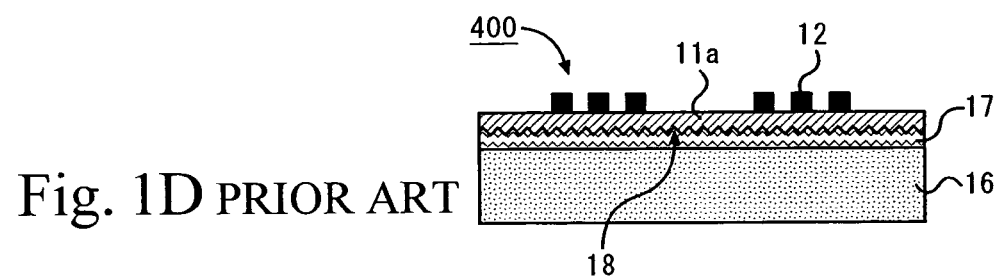
Figure 2:
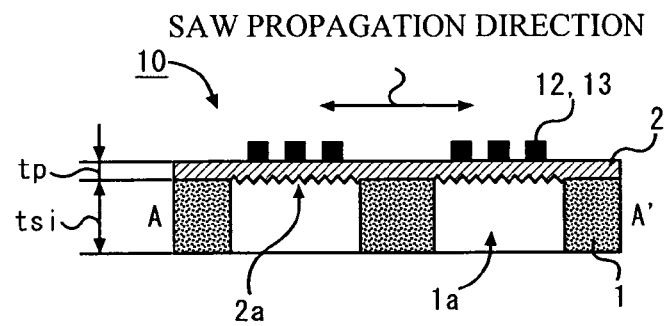
FIG. 2 is a cross-sectional view of a surface acoustic wave device according to a first embodiment of the present invention.
Figure 3:
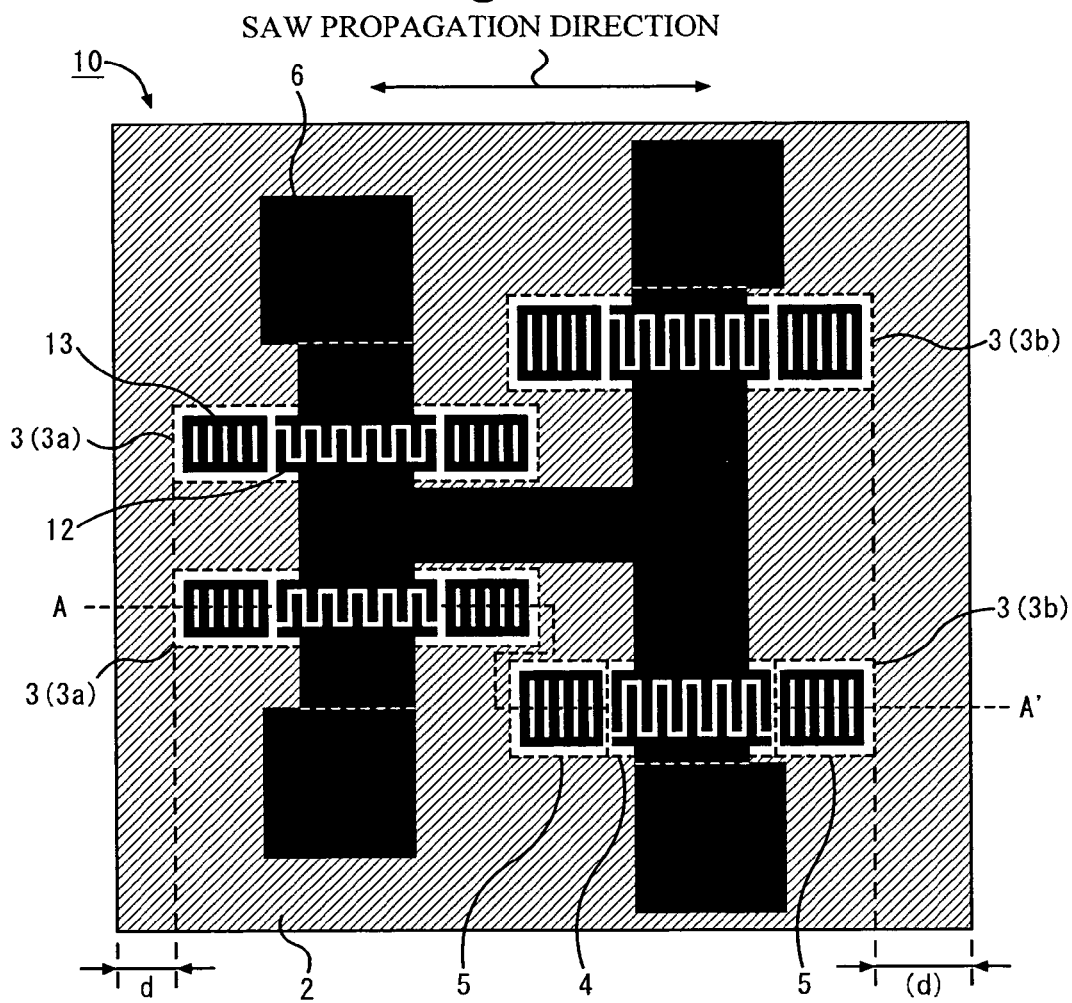
FIG. 3 is a plan view of the surface acoustic wave device shown in FIG. 2.

FIG. 2 is a cross-sectional view of a surface acoustic wave device 10 according to the second embodiment of the present invention. FIG. 3 is a plan view of the device 10, in which the cross-section of FIG. 2 is taken along a line A–A' shown in FIG. 3. The device 10 is a band-pass filter in which multiple series-arm resonators 3a arranged in series arms and multiple parallel-arm resonators 3b are arranged in ladder formation.

Referring to FIG. 2, the surface acoustic wave device 10 has cavities 1a formed in a substrate 1 on which a piezoelectric substrate 2 like a film is grown. Comb-like electrodes (which are also referred to as interdigital transducer electrodes; IDT electrodes) 12 and reflection electrodes 13 are formed on the piezoelectric substrate 2. The substrate 1 and the piezoelectric substrate 2 are bonded by the direct-bonding technique.

The piezoelectric substrate 2 may be made of lithium tantalate (LT) or lithium niobate (LN). The substrate 1 is made of a material having a lower thermal expansion coefficient than that of the piezoelectric substrate 2, and may, for example, silicon. Material such a lower thermal expansion coefficient is referred to as low-expansion material. The use of silicon as low-expansion material makes it possible to easily form the cavities 1a in the substrate 1 by the RIE apparatus. Also, the use of silicon makes it possible to easily form rough surfaces 2a on the bottom of the piezoelectric substrate 2, which rough surfaces 2a are exposed via the cavities 1a.

The rough surfaces 2a formed on the bottom of the piezoelectric substrate 2 function to prevent the filter characteristics from being degraded by bulk waves reflected by the backside of the piezoelectric substrate 2. The rough surfaces 2a may be omitted. That is, the back surface of the piezoelectric substrate 2 may be flat. Even for the flat back surface of the piezoelectric substrate 2, similar effects may be brought about.

The cavities 1a may be provided to the individual resonators 3. Each resonator 3 is formed so as to include the IDT electrode 12 and a portion of the piezoelectric substrate 2 just below an area including the IDT electrode 12. Therefore, the cavities 1a may have a minimum area, so that the effects of the substrate 1 made of low-expansion material can be maximized. The cavities 1a may be formed so as to extend up to a pair of reflectors 5 arranged on both sides of each of the ITD electrodes 12. Each of the reflectors 5 is formed so as to include a reflector electrode 13 and a portion of the piezoelectric substrate 2 just below an area including the reflector electrode 13. In other words, each cavity 1a may be formed just below the respective resonator 3 made up of the IDT electrode including comb-like electrodes and the pair of reflector electrodes 12.

The positions of the resonators 3 on the surface acoustic wave device 10 (in other words, the positions on the chip) are determined based on the thickness tsi (FIG. 2) of the substrate 1 and the thickness tp of the piezoelectric substrate 2 (FIG. 2), or based on only the thickness tp of the piezoelectric substrate 2. Now, a description will be given, with reference to FIG. 4, of a relation between the thicknesses tsi and tp and a distance d from the end of the surface acoustic wave device 10 to the end of the resonators 3 in the SAW propagation direction.

Figure 4:
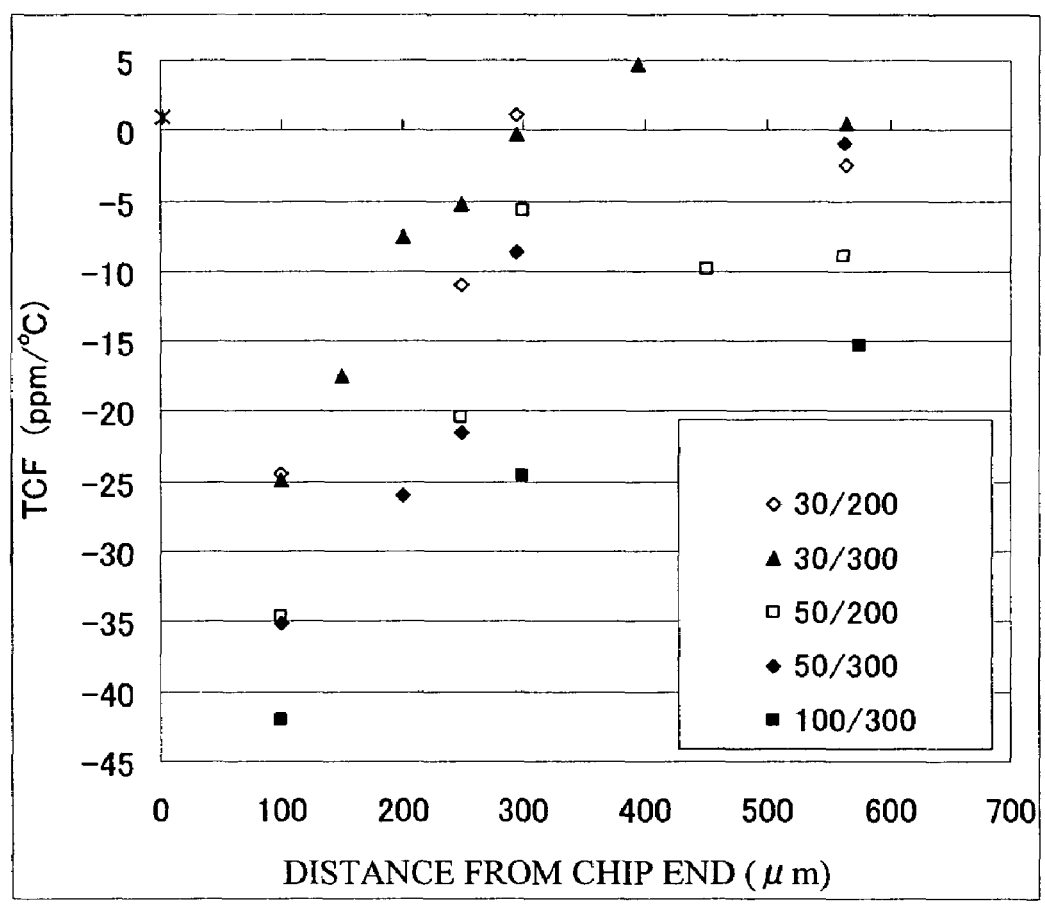
FIG. 4 is a graph showing a relation between substrate thicknesses tsi and tp and a distance d from ends of the surface acoustic wave device shown in FIGS. 2 and 3 in a SAW propagation direction.

FIG. 4 is a graph of results of structural analysis of the surface acoustic wave device 10 using the finite element method. The device 10 analyzed included the piezoelectric substrate 2 of LT and the silicon substrate 1 directly bonded to the substrate 2. In the structural analysis, the ratio of the thickness tp of the piezoelectric substrate 2 to the thickness tsi of the substrate 1 was changed for sample devices 10 having different positions of the resonators 3, and TCF (Temperature Coefficient of Frequency) characteristics are computed. Each device 10 had a first side of 1.8 mm in the SAW propagation direction and a second side of 1.2 mm perpendicular thereto. The thickness tsi of the substrate 1 and the thickness tp of the piezoelectric substrate 2 used were shown in FIG. 4. The distance d was defined as the shortest distance measured from either end of the chip to the closer end of each resonator 3 to the end of the chip in the SAW propagation direction.

The piezoelectric substrate 2 alone without the substrate 1 has a TCF value of approximately −40 ppm/° C. The graph of FIG. 4 shows that the TCF values vary greatly for a TCF value of −25 ppm/° C. or lower. Therefore, the present embodiment of the invention uses a valid area that exceeds a TCF value of −25 ppm/° C.

A further description will be given of the graph of FIG. 4. The TCF value that depends on the thickness tp of the piezoelectric substance 2 is approximately −25 ppm/° C. for a thickness tp of 30 μm and a distance d of 100 μm, and is also −25 ppm/° C. for a thickness tp of 50 μm and a distance d of about 200 μm. Further, The TCF value is approximately −25 ppm/° C. for a thickness tp of 100 μm and a distance d of 300 μm. The TCF value slightly depends on the thickness tsi of the substrate 1, but may be negligible.

From the above-mentioned consideration of the graph of FIG. 4, when the distance d satisfies expression (1) mentioned below, a good TCF value can be obtained:

$$d \geq 3\, tp \quad (1)$$

When the distance d is equal to three times of the thickness of the piezoelectric element 2 or greater, a good TCF value can be obtained. Expression (1) may be applied to not only the surface acoustic wave devices having cavities but also devices with no cavities.

According to the first embodiment of the present invention, the silicon substrate that has a relatively low thermal expansion ratio is employed, so that compression and expansion due to temperature change can be suppressed and the temperature stability can be improved without degrading the electromechanical coupling coefficient. The cavities 1a can easily be formed by the silicon substrate 1 by RIE. The use of RIE makes it possible to easily form the rough bottom surfaces of the cavities 1a, which contribute to scattering the bulk waves. It is therefore possible to prevent degradation of the filter characteristics by ripples and spurious resulting from reflection of the bulk waves.

Further, according to the present embodiment of the invention, the resonators 3 are positioned with respect to the ends of the chip of the surface acoustic wave device 10 on the basis of the thickness tp of the piezoelectric substrate 3 (and additionally the thickness tsi of the substrate 1 as necessary). It is therefore possible to improve the temperature characteristic without relaxing stress due to stiffness of the substrate 1. In other words, the present embodiment of the invention optimizes the thickness of the piezoelectric substrate 2 and the positions of the resonators 3 to thereby realize the surface acoustic wave device having small frequency variation. Similar effects can be obtained even when the piezoelectric substrate of LT is replaced by LN. The surface acoustic wave device 10 is particularly useful to a device that utilizes a leaky surface acoustic wave.

A description will now be given of a process for fabricating the surface acoustic wave device 10. By way of example, the following description is directed to a fabrication process for the device 10 employing the silicon substrate 1 that is 300 μm thick and the LT substrate 2 that is 50 μm thick.

FIGS. 5A through 5C are cross-sectional views of the device 10 that show the fabrication process. Referring to FIG. 5A, a 42° Y-cut X-propagation LT substrate 2 is adhered to the silicon substrate 1 by direct bonding. Besides direct bonding, the LT substrate 2 may directly be bonded to the silicon substrate 1 by another appropriate method. Next, the LT substrate 2 is subjected to grinding and polishing until the LT substrate 2 becomes about 50 μm thick. Then, a conductive material is deposited and is patterned into the IDT electrodes 12 and the reflection electrodes 13 by exposing and etching. The IDT electrodes 12 and the reflection electrodes 13 may include, as a major component, at least one of gold (Au), aluminum (Al), copper (Cu), titanium (Ti). The resonators 3 including the IDT electrodes 12 and the reflection electrodes 13 are positioned at a distance of 200 μm from the ends of the chip 10 opposing each other in the SAW propagation direction.

Referring to FIG. 5B, the portions of the substrate 1 just below the IDT electrodes 12 and he reflector electrodes 13 are removed from the backside of the device 10 by deep RIE (bosch process) using inductively coupled plasma (ICP). Table 1 shows parameters in the etching step and deposition step in the bosch process. The cavities 1a may be formed only under the IDT electrodes 12 so that it does not extend over the IDT electrodes 12.

TABLE 1

| | Gas/flow rate | Pressure | RF power | Process time |
|---|---|---|---|---|
| Etching step | $SF_6$/ 450 sccm | 43 mTorr | 2200 W | 9.5 sec |
| Deposition step | $C_4F_8$/ 200 sccm | 22 mTorr | 1500 W | 3.0 sec |

Referring to FIG. 5B, the etching step and the deposition step with the above-mentioned parameters are repeatedly carried out by 250 cycles until the cavities 1a penetrate through the 300 μm-thick silicon substrate 1 by etching. The ICP etching process may be replaced by a dry etching, wet etching or sandblast process.

After the substrate 1 is etched so that the piezoelectric substrate 2 is exposed, as shown in FIG. 5C, the exposed bottom surfaces of the piezoelectric substrate 2 are made rough by, for example, the sandblast process. This results in the rough surfaces 2a.

The surface acoustic wave device 10 can be produced by the above-mentioned process. The device 10 may be packaged by a housing 10A, so that a packaged filter device can be provided. The inside of the package 10A may be filled with dry nitrogen or evacuated, so that hermetically seal can be realized.

Preferably, the substrate 1 may be made of particular silicon that has a relatively low resistivity equal to or lower than 1 Ω·cm. In this case, a parasitic capacitance (terminal based capacitance) may develop between an electrode pad 6 (FIG. 3) and the silicon substrate 1. In order to suppress degradation of the resonance characteristics due to the parasitic capacitance, it is preferable to form the areas of the electrode pads 6 as small as possible. This reduces the resistance component of the terminal based capacitance and suppresses degradation of the resonance characteristics. The surface acoustic wave filter thus structured has a reduced loss and may serve as a band-pass filter having improved filter characteristics.

Figure 7:
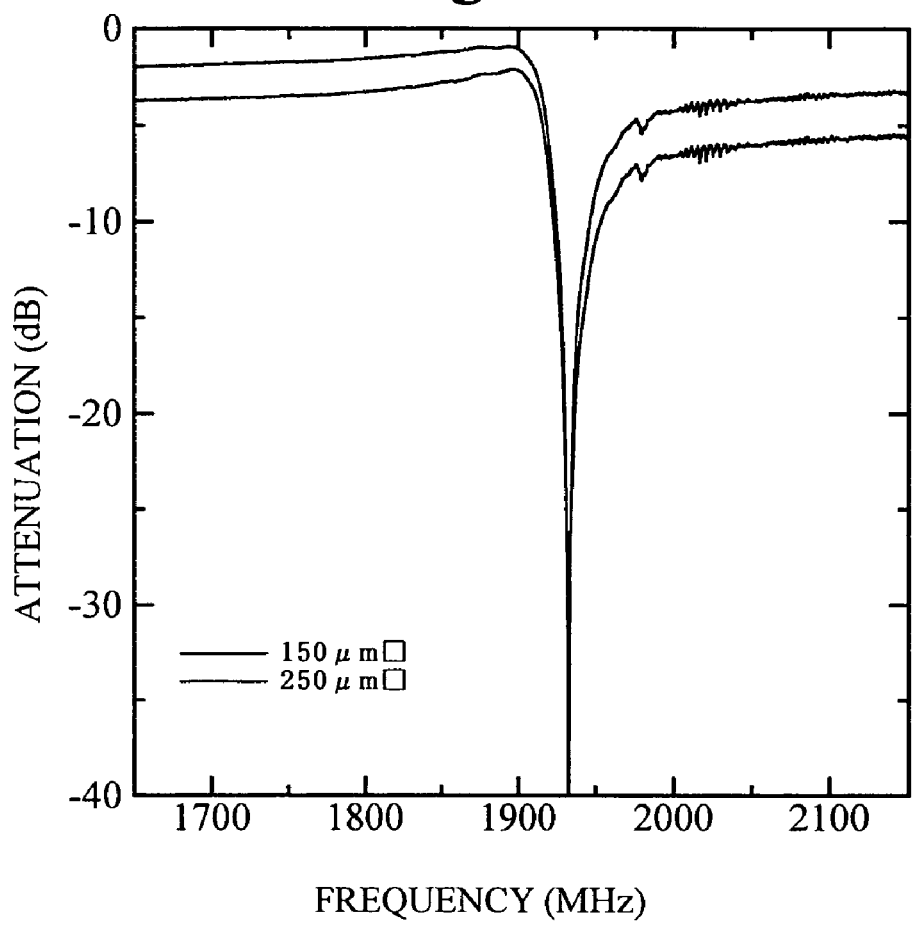
FIG. 7 is a graph showing results of simulation of the filter characteristic of the first embodiment devices having different electrode pad sizes

FIG. 7 shows results of simulation of two samples, one of which employs an electrode pad of 150 μm×150 μm, and the other employs an electrode pad of 250 μm×250 μm. These samples have the piezoelectric substrate 2 that is 50 μm thick, and the substrate 1 that is 300 μm thick. It can be seen from FIG. 7 that the smaller size of the electrode pads 6 provided less attenuation (or loss) and the filter characteristics can be improved in the case where the substrate 1 is made of a relatively low resistivity as described before.

Second Embodiment

A description will now be given of a second embodiment of the present invention. The above-described first embodiment of the present invention employs the silicon substrate 1 having a comparative low resistance. In contrast, according to the second embodiment of the invention, the relatively low resistance substrate 1 of silicon is replaced by a material having a relatively high resistivity equal to or larger than 10 Ω·cm. Such a material may, for example, be non-doped silicon.

The use of material having such a high resistivity increases the Q value of the terminal based capacitance and thus reduces the resonant resistance of the resonators. This enables the surface acoustic wave filters with low loss.

When the substrate of silicon having a relatively high resistivity is used, the cavities 1a may be located just below the resonators 3 or only the IDT electrodes 12. The other structure of the second embodiment of the present invention is the same as that of the first embodiment thereof, and a description thereof will be omitted here.

Third Embodiment

Figure 8:
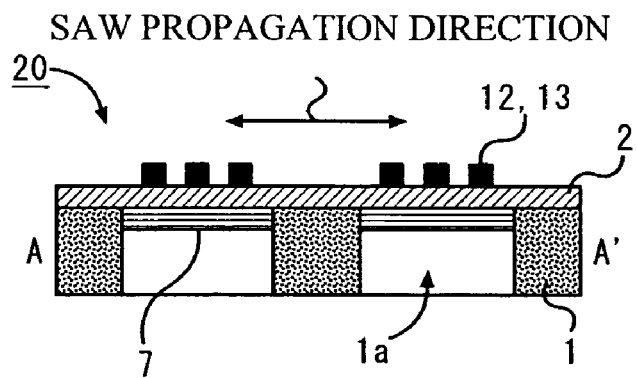
FIG. 8 is a cross-sectional view of a surface acoustic device according to a third embodiment of the present invention.

FIG. 8 is a cross-sectional view of a surface acoustic device 20 according to a third embodiment of the present invention. The device 20 does not have the rough bottom surfaces of the piezoelectric substrate 2, which surfaces are exposed through the cavities 1a. In contrast, the bottom surfaces of the piezoelectric substrate 2 exposed through the cavities 1a are flat, and acoustic absorption members 7 are provided on the flat bottom surfaces of the piezoelectric substrate 2. The acoustic absorption members 7 may be epoxy resin, which is grown on the flat bottom surfaces exposed through the cavities 1a.

The acoustic absorption members 7 function to absorb the bulk waves and suppress reflection thereof. It is therefore possible to prevent degradation of the filter characteristics due to ripple and spurious caused by reflection of the bulk waves. The other structural portions of the third embodiment of the present invention are the same as those of the first embodiment, and a description thereof will be omitted.

Fourth Embodiment

Figure 9:
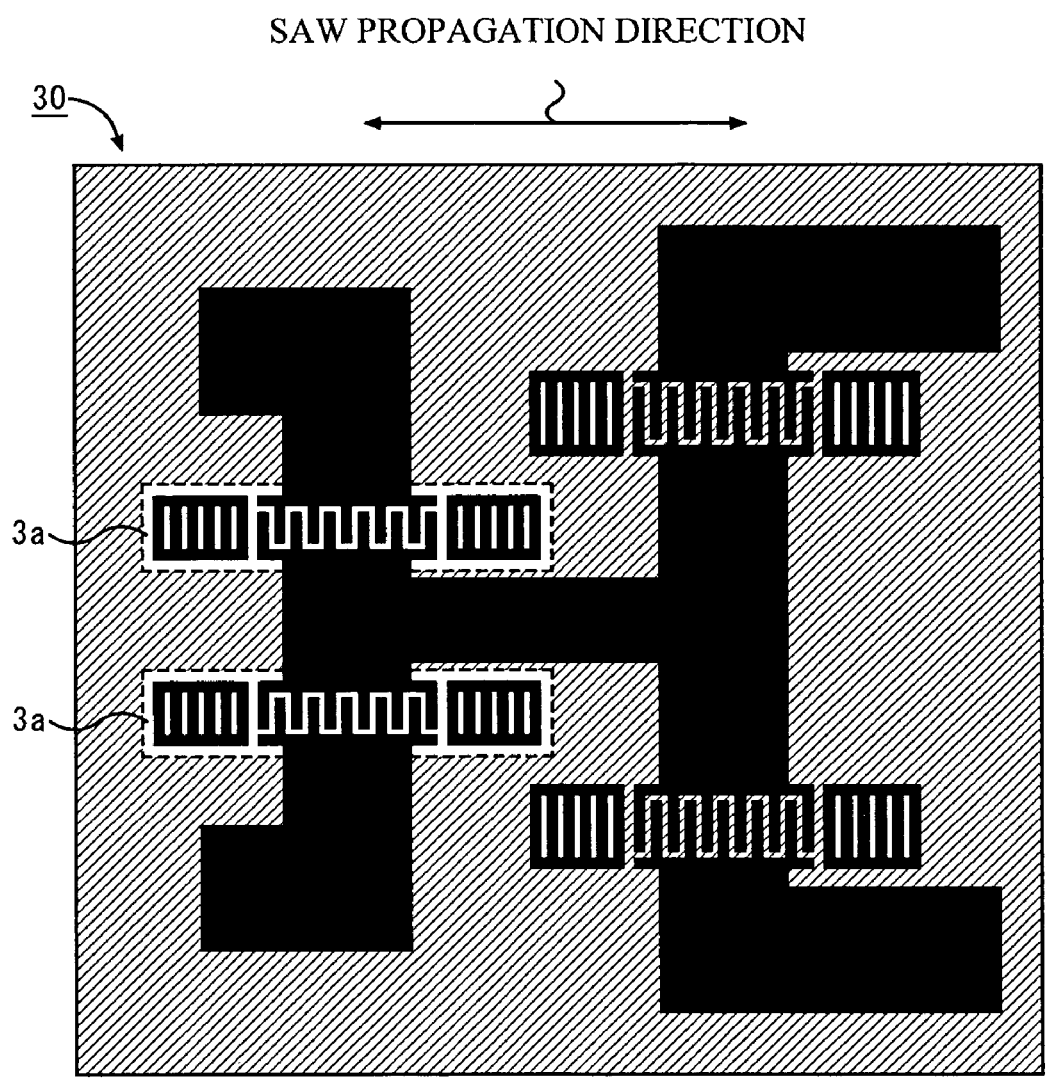
FIG. 9 is a plan view of a surface acoustic device according to a fourth embodiment of the present invention.
Figure 10:
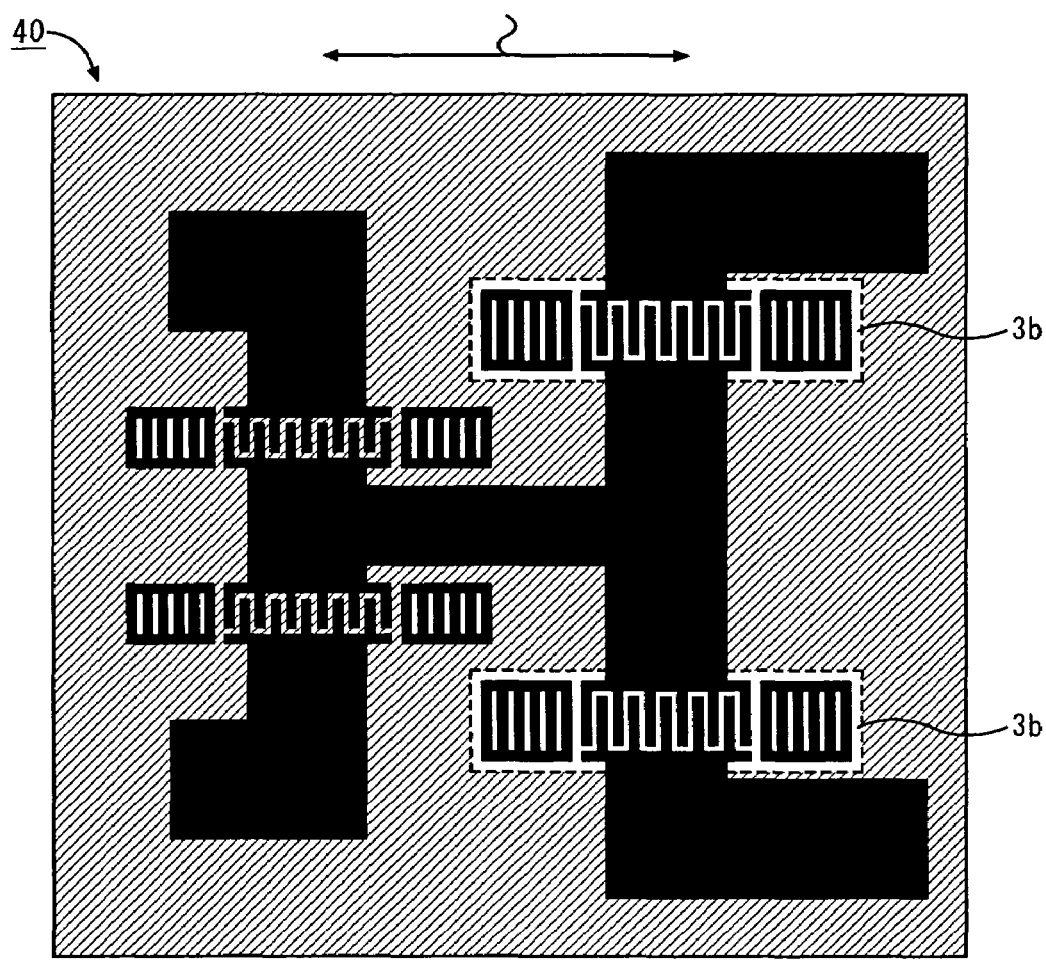
FIG. 10 is a plan view of another surface acoustic device according to the fourth embodiment of the present invention.

FIG. 9 is a plan view of a surface acoustic device 30 according to a fourth embodiment of the present invention. In the aforementioned first embodiment of the present invention, the cavities 1a are provided to all the resonators 3 or all the IDT electrodes 12. In contrast, according to the fourth embodiment of the present invention, the cavities 1a are provided to only the series-arm resonators of a ladder type device. Alternatively, as shown in FIG. 9, the cavities 1a may be provided to only the parallel-arm resonators. In short, at least one cavity 1a is provided to one of the resonators. The remaining structural portions of the fourth embodiment of the present invention are the same as those of the first embodiment of the invention.

According to one aspect of the present invention, at least one cavity is formed below the resonator that includes the silicon substrate that is thermally more stable and more easily processible than the piezoelectric substrate and the piezoelectric substrate having a relatively large electromechanical coupling coefficient wherein these substrates are directly bonded. With this structure, it is possible to realize the surface acoustic wave device that has a large electromechanical coupling coefficient, improved temperature stability and good productivity without degrading the filter characteristics.

According to another aspect of the present invention, the resonators are positioned at a distance from the ends of the directly bonded substrates or chip opposing each other in the SAW propagation direction. With this arrangement, it is possible to improve the temperature stability of the surface acoustic wave device.

According to yet another aspect of the present invention, the packaged filter device that employs the above-described surface acoustic wave device is provided. Also, the method of fabricating the surface acoustic wave device having the above-mentioned features is provided.

The present invention is not limited to the specifically disclosed embodiments, and other embodiments, variations and modifications may be made without departing from the scope of the present invention.

The present invention is based on Japanese Patent Application No. 2002-258642, the entire disclosure of which is hereby incorporated by reference.

What is claimed is:

1. A surface acoustic wave device comprising:
   a piezoelectric substrate on which at least two resonators having comb-like electrodes are formed; and
   a silicon substrate that is directly bonded to the piezoelectric substrate and is less expansive than the piezoelectric substrate, wherein under each of said at least two resonators a cavity is formed in the silicon substrate.

2. The surface acoustic wave device as claimed in claim 1, wherein each of the at least two resonators has reflector electrodes close to the comb-like electrodes thereof, and the cavity is located below the comb-like electrodes and the reflector electrodes.

3. The surface acoustic wave device as claimed in claim 1, wherein the cavity is formed in the silicon substrate and is located below only an area that includes the comb-like electrodes of a corresponding one of the at least two resonators.

4. The surface acoustic wave device as claimed in claim 1, wherein the piezoelectric surface has a rough surface that is exposed through the cavity.

5. The surface acoustic wave device as claimed in claim 1, further comprising an acoustic absorption member provided on a surface portion of the piezoelectric substrate exposed through the cavity.

6. The surface acoustic wave device as claimed in claim 1, further comprising another resonator wherein no cavity is formed in the silicon substrate located below said another resonator.

7. The surface acoustic wave device according to claim 1, wherein the piezoelectric substrate is made of one of lithium tantalate and lithium niobate.

8. The surface acoustic wave device as claimed in claim 1, wherein
   the silicon substrate that is directly bonded to the piezoelectric substrate and is less expansive than the piezoelectric substrate; and
   the silicon substrate has a resistivity equal to or greater than 10Ωcm.

9. The surface acoustic wave device as claimed in claim 1, wherein
   the silicon substrate that is directly bonded to the piezoelectric substrate and is less expansive than the piezoelectric substrate,
   the resonators are located at a distance d from ends of the device in a direction in which a surface acoustic wave propagates, and
   the distance d satisfies $d \geq 3\, t_p$ where $t_p$ is a thickness of the piezoelectric substrate.

10. The surface acoustic wave device as claimed in claim 1, further comprising electrode pads provided on the piezoelectric substrate and electrically coupled to the resonators.

* * * * *